United States Patent
Karabed et al.

(10) Patent No.: US 9,425,823 B1
(45) Date of Patent: Aug. 23, 2016

(54) STATE-SPLIT BASED ENCODER AND DECODER WITH TABLE COMPRESSION

(71) Applicant: Avago Technologies General IP (Singapore) Pte. Ltd., Singapore (SG)

(72) Inventors: Razmik Karabed, San Jose, CA (US); Ebad Ahmed, San Jose, CA (US); Victor Krachkovsky, Allentown, PA (US); Shaohua Yang, San Jose, CA (US); Hakan C. Ozdemir, San Jose, CA (US); Zhiwei Wu, Shanghai (CN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/666,133

(22) Filed: Mar. 23, 2015

(51) Int. Cl.
  *G11B 5/09* (2006.01)
  *H03M 7/42* (2006.01)
  *H03M 7/46* (2006.01)
  *G11B 20/00* (2006.01)

(52) U.S. Cl.
  CPC .......... *H03M 7/42* (2013.01); *G11B 20/00007* (2013.01); *H03M 7/46* (2013.01)

(58) Field of Classification Search
  CPC ........ G11B 5/09; G11B 5/00; G11B 5/59688; G11B 5/59655; G11B 20/10009; G11B 5/012; G11C 29/00; G11C 11/56; G11C 11/26; G11C 11/5638; G06F 11/14
  USPC ............ 360/65, 24, 29, 39, 55; 714/746, 773, 714/704; 365/185.03, 185.09
  See application file for complete search history.

(56) References Cited

U.S. PATENT DOCUMENTS

| | | | |
|---|---|---|---|
| 6,373,408 B1 | 4/2002 | Kimura et al. | |
| 6,690,842 B1 * | 2/2004 | Silver | G06T 7/0083 382/199 |
| 9,003,263 B2 * | 4/2015 | Karabed | G11C 11/5642 365/185.03 |
| 2005/0169465 A1 * | 8/2005 | Itani | H04L 9/0656 380/42 |
| 2008/0027973 A1 * | 1/2008 | Watanabe | G06F 17/30817 |
| 2013/0238959 A1 * | 9/2013 | Birk | G11C 7/02 714/773 |

FOREIGN PATENT DOCUMENTS

EP  2169833 A1  3/2010

OTHER PUBLICATIONS

Kim, "Modulation Coding for Flash Memories", Proc. IEEE Int'l Conf on Computing, Networking and Comm (ICNC), Jan. 2013.

* cited by examiner

*Primary Examiner* — Nabil Hindi

(57) ABSTRACT

A data encoder includes an encoding logic circuit configured to encode input data to apply run length limiting using state splitting of a code trellis, and a lookup table configured to apply a block-enumerable map on an un-split version of the code trellis, wherein entries in the lookup table are compressed.

20 Claims, 3 Drawing Sheets

STATE-SPLIT BASED ENCODER AND DECODER WITH TABLE COMPRESSION

FIELD OF THE INVENTION

Various embodiments of the present invention provide systems and methods for table compression in a state-split based encoder and/or decoder.

BACKGROUND

Various products including hard disk drives and transmission systems utilize a read channel device to encode data, store or transmit the encoded data on a medium, retrieve the encoded data from the medium and decode and convert the information to a digital data format. Such read channel devices may include data processing circuits including encoder and decoder circuits to encode and decode data as it is stored and retrieved from a medium or transmitted through a data channel, in order to reduce the likelihood of errors in the retrieved data. It is important that the read channel devices be able to rapidly and accurately decode the original stored data patterns in retrieved or received data samples. The encoded data may be constrained to follow one or more rules that reduce the chance of errors. For example, when storing data on a hard disk drive, it may be beneficial to avoid long runs of consecutive transitions, or long runs of 0's or 1's.

BRIEF SUMMARY

Some embodiments of the present invention provide a data encoder with an encoding logic circuit configured to encode input data to apply run length limiting using state splitting of a code trellis, and a lookup table configured to apply a block-enumerable map on an un-split version of the code trellis, wherein entries in the lookup table are compressed.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

Various embodiments of the present invention provide systems and methods for encoding and decoding data using a compressed lookup table. In some embodiments, the compressed lookup table is applied in an E6SR state split run length limiting (RLL) encoder and corresponding decoder, although it can be used in any suitable encoder and decoder. Run length limiting encoding can be used in storage systems such as, but not limited to, hard disk drives, in transmission systems, and other data processing systems, to limit long repetitions of undesirable binary patterns. This can improve signal to noise ratio with relatively low size, latency and power requirements. However, the memory size of lookup tables in run length limiting encoders and decoders can be undesirably large. As disclosed herein, a run length limiting encoder and decoder, and specifically in some embodiments an E6SR state split based run length limiting encoder and decoder, is provided with a lookup table that stores entries in compressed formats to reduce memory requirements. In some embodiments, linear compression techniques are used in the lookup table, including first-order column difference, column averaging, and row+column difference based compression. In some embodiments, polynomial curve fitting compression techniques are used in the lookup table, including polynomial fitting, piecewise polynomial fitting, and logarithm+polynomial fitting.

Figure 1:
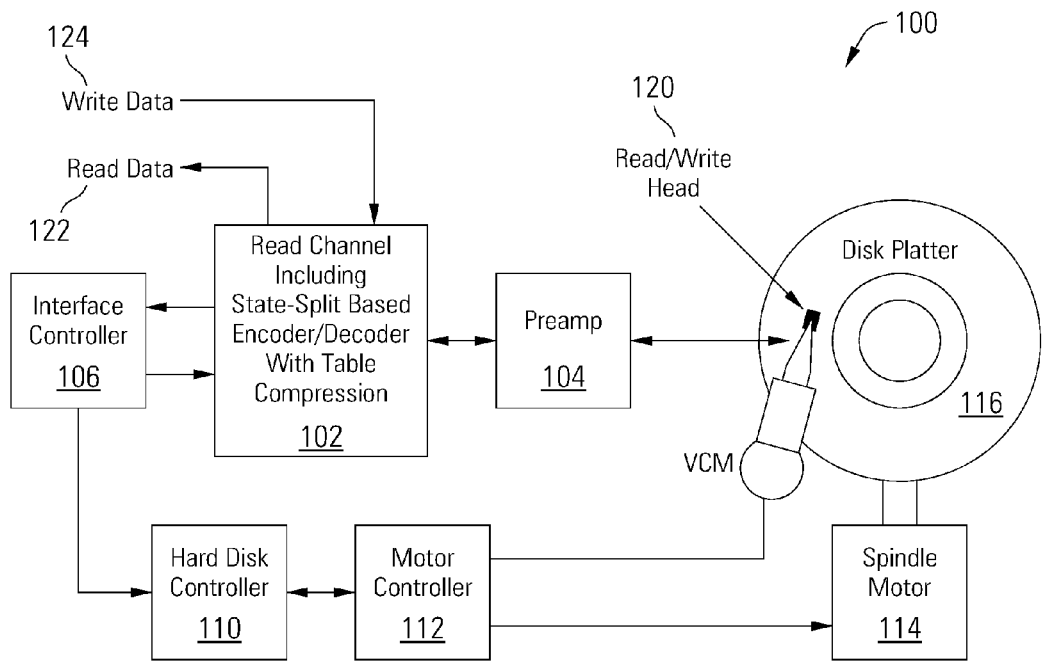
FIG. 1 depicts a storage system including a state-split based encoder and decoder with table compression in accordance with some embodiments of the present invention.

Although an encoder and decoder with compressed lookup tables disclosed herein are not limited to use in any particular application, they may be used in a read channel of a storage device. Turning to FIG. 1, a storage system 100 including a read channel circuit 102 with an encoder and decoder with compressed lookup tables is shown in accordance with some embodiments of the present inventions. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly to the proper data track on disk platter 116 under the direction of hard disk controller 110. Spindle motor 114 spins disk platter 116 at a determined spin rate (RPMs). Once read/write head assembly 120 is positioned adjacent the proper data track, write data 124 is provided to read channel circuit 102 where it is encoded in an run length limiting encoder with lookup table compression. The encoded data can be further processed as desired, for example adding parity bits for error detection and correction, and is then recorded to the disk platter 116. A read operation is substantially the opposite of the write operation, with read/write head assembly 120 is positioned adjacent the proper data track, and with magnetic signals representing data on disk platter 116 sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 digitizes and decodes the received analog signal to reverse the run length limiting encoding using a decoder with table compression. The read data can be further processed as desired, for example performing error correction, and the resulting data is provided as read data 122 to a receiving circuit.

Storage system 100 can be integrated into a larger storage system such as, for example, a RAID (redundant array of inexpensive disks or redundant array of independent disks) based storage system. Such a RAID storage system increases stability and reliability through redundancy, combining multiple disks as a logical unit. Data can be spread across a number of disks included in the RAID storage system according to a variety of algorithms and accessed by an operating system as if it were a single disk. For example, data can be mirrored to multiple disks in the RAID storage system, or can be sliced and distributed across multiple disks in a number of techniques. If a small number of disks in the RAID storage system fail or become unavailable, error correction techniques can be used to recreate the missing data based on the remaining portions of the data from the other disks in the RAID storage system. The disks in the RAID storage system can be, but are not limited to, individual storage systems such as storage system 100, and can be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 2:
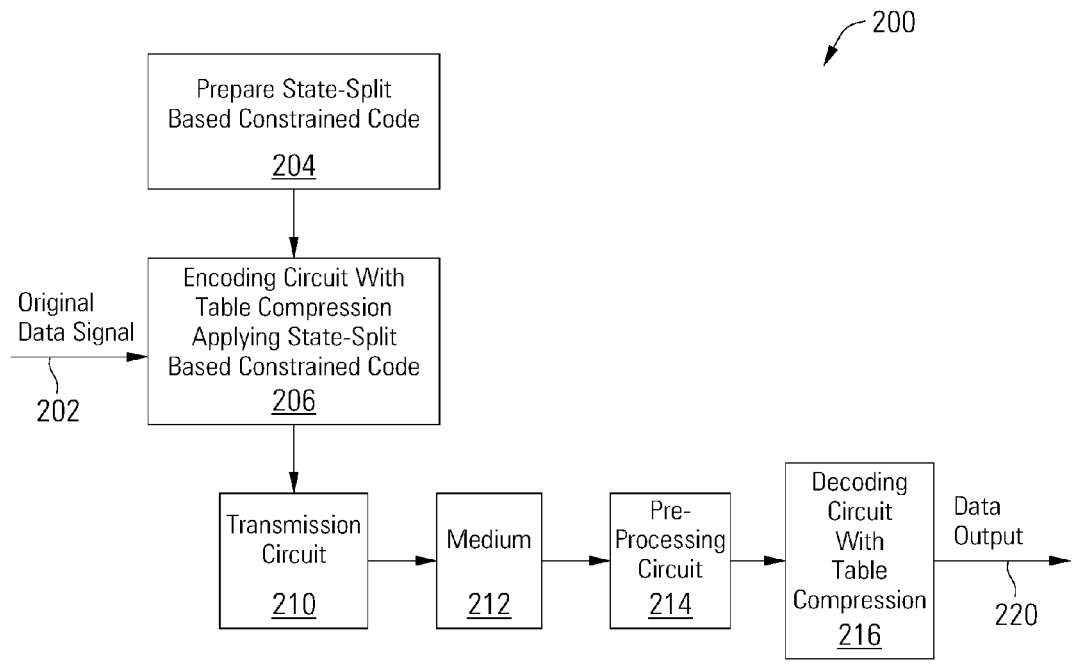
FIG. 2 depicts a data processing system including a state-split based encoder with table compression in accordance with some embodiments of the present invention.

Turning to FIG. 2, a data processing system 200 relying on a run length limit encoder with table compression and corresponding decoder with table compression is shown in accordance with various embodiments of the present invention. Data processing system 200 includes a run length limit encoder with table compression 206 that applies constraint encoding to an original input 202. Original input 202 may be any set of input data. For example, where data processing system 200 is a hard disk drive, original input 202 may be a data set that is destined for storage on a storage medium. In such cases, a medium 212 of data processing system 200 is a storage medium. As another example, where data processing system 200 is a communication system, original input 202 may be a data set that is destined to be transferred to a receiver via a transfer medium. Such transfer mediums may be, but are not limited to, wired or wireless transfer mediums. In such cases, a medium 212 of data processing system 200 is a transfer medium. The design or instructions for the encoder 206 and decoder 216 are received from a block 204 that generates a state-split based run length limiting encoder and decoder.

Encoding circuit with table compression 206 provides encoded data (i.e., original input encoded using the multiplication and division free encoder) to a transmission circuit 210. Transmission circuit 210 may be any circuit known in the art that is capable of transferring the received encoded data via medium 212. Thus, for example, where data processing circuit 200 is part of a hard disk drive, transmission circuit 210 may include a read/write head assembly that converts an electrical signal into a series of magnetic signals appropriate for writing to a storage medium. Alternatively, where data processing circuit 200 is part of a wireless communication system, transmission circuit 210 may include a wireless transmitter that converts an electrical signal into a radio frequency signal appropriate for transmission via a wireless transmission medium. Transmission circuit 210 provides a transmission output to medium 212.

Data processing circuit 200 includes a pre-processing circuit 214 that applies one or more analog functions to transmitted input from medium 212. Such analog functions may include, but are not limited to, amplification and filtering. Based upon the disclosure provided herein, one of ordinary skill in the art will recognize a variety of pre-processing circuitry that may be used in relation to different embodiments of the present invention. Pre-processing circuit 214 provides a pre-processed output to a decoding circuit with table compression 216. Decoding circuit with table compression 216 includes a decoder that is capable of reversing the encoding process applied by encoding circuit 206 to yield data output 220.

Figure 3:
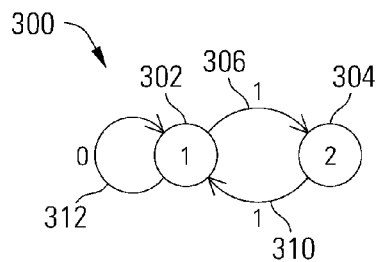
FIG. 3 depicts a digraph illustrating a constrained system in accordance with some embodiments of the present invention.

Turning to FIG. 3, a simple labeled digraph (DG) 300 is shown having two states, state 1 302 and state 2 304, with paths or edges entering and exiting the states 302 and 304 that are labeled to indicate the output value when that path is taken. From state 1 302 a self-loop 312 is labeled 0 to indicate that a 0 is output when the system transitions from state 1 302 back to state 1 302 in one step. An arc 306 from state 1 302 to state 2 304 is labeled 1, indicating that a 1 is output when the system transitions from state 1 302 to state 2 304. Arc 310 from state 2 304 to state 1 302 is labeled 1. Given a labeled digraph 300, the output can be determined by taking the paths from state to state. For example, starting from state 1 302 and taking self-loop 312, arc 306, arc 310 and self-loop 312 yields an output of 0110. In this labeled digraph 300, 1's are produced in even numbers. When designing a code for a constrained system, a labeled digraph can be produced that characterizes the constraint set.

Constraint sequences can be mapped to sequences generated by a labeled digraph using symbolic dynamics. In this process, a connectivity matrix is generated for the labeled digraph. For the labeled digraph 300 of FIG. 3, the connectivity matrix is:

$$\begin{bmatrix} 1 & 1 \\ 1 & 0 \end{bmatrix}$$

where element 1,1 represents the connection 312 from state 1 302 to state 1 302, element 1,2 represents the connection 306 from state 1 302 to state 2 304, element 2,1 represents the connection 310 from state 2 304 to state 1 302, and the 0 in element 2,2 represents the lack of a connection from state 2 304 to state 2 304.

The highest rate code that can be designed from a labeled digraph can be computed as $\log(\lambda)$, where $\lambda$ is the largest real and positive eigenvalue of connectivity matrix. For an eigenvalue $\lambda$, there is a vector x that satisfies the equation $A*x=\lambda*x$, where A is the connectivity matrix, x is a vector, and $\lambda$ is the eigenvalue number. If the matrix A is non-negative and real, meaning that there are no complex numbers in the connectivity matrix, and that it contains 0's or positive numbers, then $\lambda$, is also a real, positive number that allows the computation of the highest rate code. If the input block length of the encoder is denoted K, and the output block length is denoted N, where N>K, the encoder can be designed to map the K input bits to N output bits in an invertible manner. Given K input bits, there are $2^K$ input patterns to be mapped to outputs. Each of the N blocks are referred to as codewords in a codeword space, generally a subset of all the possible output patterns. The resulting encoder has a rate K/N, and the higher the rate, the greater the efficiency of the encoding.

Figure 4A:
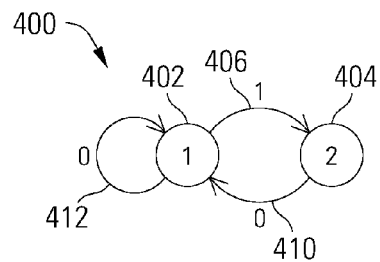
FIGS. 4A and 4B depicts a digraph and corresponding $2^{nd}$ power digraph illustrating another constrained system in accordance with some embodiments of the present invention.
Figure 4B:
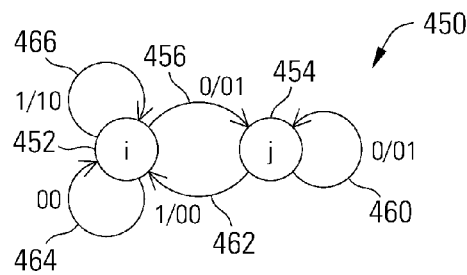

The labeled digraph characterizes the constraints and can be used to calculate the code rate, but does not define the mapping between inputs and outputs. The mapping can be performed using a power of a labeled digraph. Turning to FIGS. 4A and 4B, another labeled digraph 400 and its $2^{nd}$ power digraph 450 are shown to illustrate a possible mapping between input and output patterns. Labeled digraph 400 includes state 1 402 and state 2 404, with arc 406 from state 1 402 to state 2 404 labeled 1, arc 410 from state 2 404 to state 1 402 labeled 0, and self-loop 412 from state 1 402 labeled 0. This labeled digraph 400 will not generate two 1's in sequence. If 1's represent transitions, then no two transitions are adjacent.

To map input bits to output bits, a digraph may be taken to a power based on the rate and on the number of output bits for each input bit. For example, in a ½ rate code, two output bits are produced for every input bit, and the $2^{nd}$ power 450 of the digraph 400 may be used for the mapping. The $2^{nd}$ power digraph 450 of the digraph 400 has the same number of states, state i 452 and state j 454. There is an arc from state i 452 to state j 454 in the $2^{nd}$ power digraph 450 if there is a path of length two from state 1 402 to state 2 404 in digraph 400. Because state 1 402 to state 2 404 in digraph 400 can be reached in two steps on arcs 412 and 406, with labels 0 and 1, $2^{nd}$ power digraph 450 includes an arc 456 labeled 01 from state i 452 to state j 454. Based on the two-step paths in digraph 400, $2^{nd}$ power digraph 450 also includes self-loop 460 labeled 01 from state j 454, arc 462 labeled 00 from state j 454 to state i 452, self-loop 464 labeled 00 from state i 452 and self-loop 466 labeled 10 from state i 452. These labels represent the outputs for each state transition from state i 452 and state j 454.

Input bits can be mapped to the paths in $2^{nd}$ power digraph 450 in any suitable manner, including in a somewhat arbitrary manner. Based upon the disclosure provided herein, one of ordinary skill in the art will recognize a variety of mapping techniques that may be used to characterize a constrained code from a digraph. Each incoming bit is assigned to a path in $2^{nd}$ power digraph 450, for example assigning incoming bit 1 when received in state i 452 to self-loop 466, so that when a 1 is received in that state, a 10 is yielded at the output. (The notation 1/10 is used in the label for self-loop 466, with the incoming value before the slash and the outgoing value after the slash.) Incoming bit 0 is assigned when received in state i 452 to arc 456 so that when a 1 is received in state i 452, a 01 is output. At this point, with incoming bit values 0 and 1 having been mapped for state i 452, self-loop 464 is not needed. Incoming bit values 0 and 1 when received in state j 454 are assigned to self-loop 460 and arc 462, respectively.

The $2^{nd}$ power digraph 450 when labeled defines the encoder, because it describes fully how input bits are mapped to output bits at a rate 1:2, or code rate ½, in an invertible manner that satisfies the constraint of preventing consecutive 1's.

In this simple example, each state 452 and 454 had sufficient outgoing edges to map each possible input bit. However, given a digraph and its powers, this is often not the case. For example, to design a ⅔ code rate encoder based on labeled digraph 400, the labeled digraph 400 is taken to the $3^{rd}$ power, yielding connectivity matrix $$\begin{bmatrix} 2 & 1 \\ 1 & 1 \end{bmatrix}$$

for the $2^{nd}$ power and connectivity matrix $$\begin{bmatrix} 3 & 2 \\ 2 & 1 \end{bmatrix}$$

for the 3rd power. This indicates that state 1 in the $3^{rd}$ power digraph will have 5 outgoing edges and state 2 in the $3^{rd}$ power digraph will have 3 outgoing edges. Given two input bits in the ⅔ code rate encoder, four outgoing edges are needed from each state, and state 2 has too few outgoing edges, preventing the simple mapping of input to output bits in a power of the original digraph as in FIGS. 4A and 4B.

State splitting may be used to manipulate the digraph to produce another digraph that generates the same sequences, but for which every state has at least the necessary number of outgoing edges so that the encoder can be designed by arbitrarily assigning input bits to outgoing edges. State splitting redistributes outgoing edges, taking them from states with an excess and redistributing them to states with insufficient edges until each state has at least the minimum number of outgoing edges to achieve the desired code rate. In general, because $\lambda$ can be any real number, the x vector may also be a non-integral real number. Given a $\log(\lambda)$ that is at least slightly larger than the desired code rate, a non-negative integer approximate eigenvector can be found that satisfies the equation $A*x \geq \lambda*x$, where x is a non-negative integer that enables the use of a state splitting algorithm.

In general, state splitting is performed by identifying the largest coordinates of vector x and splitting the corresponding state into a number of smaller states. The outgoing edges from the original state are partitioned into two or more subsets, each of which are assigned to a new state. Each of the new smaller states have the same input as the original state. The resulting digraph thus has more states than the original digraph, with a new approximate eigenvector. In some embodiments, the end result of the state splitting operation is an approximate eigenvector in which every state has a coordinate or weight of 1 or 0, with the number of states equaling the sum of the coordinates of vector x.

State splitting can also be performed to reduce the number of branches in the states in the final digraph. In general, state-split based coding methods start from an initial labeled digraph DGs with an approximate integer eigenvector AEs, and produce a final labeled digraph DGf with an approximate eigenvector AEf of all ones and zeros, or with coordinates of all ones and zeros. The approximate eigenvector AEf of final labeled digraph DGf together with a 1:1 map E:$\{0,1\}^m \to S$ define the code which the encoder and decoder apply. Set S comprises all finite sequences obtained from reading the labels of paths in labeled digraph DGf. In practice, there are many parameters contributing to the hardware complexity of the encoder and decoder for the resulting code, including the number of states in AEf, the memory/anticipation in labeled digraph DGf, the rate of the code, the block length of the code, and the number of branches of the states in DGf. In general, states with many branches contribute more to hardware complexity than states with fewer branches. The state-split based coding method is therefore designed to produce a final digraph DGf having states with a small number of branches, and in some embodiments, to have only states with one branch. In other state splitting coding methods, AEs is chosen to be as small as possible. However, in the state splitting used to generate the state-split based endec disclosed herein, AEs is scaled to go from DGs to DGf in one round of state splitting, and to produce a final digraph DGf with only one branch per state, thereby easing the hardware complexity associated with state branching.

A labeled digraph DG=(V, A, L) consists of a finite set of states V=$V_{DG}$, a finite set of arcs A=$A_{DG}$ where each arc e has an initial state $\sigma_{DG}(e) \in V_{DG}$ and a terminal state $\tau_{DG}(e) \in V_{DG}$, and an arc labeling L=$L_{DG}$: A→H where H is a finite alphabet. A set of all finite sequences obtained from reading the labels of paths in a labeled digraph DG is called a constrained system, S. DG presents S, denoted by S=S (DG).

Given a digraph DG, a non-negative integer vector AE is an approximate integer eigenvector if:

$$T(DG)*AE(DG) \geq P+2^m*AE(DG) \qquad \text{(Eq 1)}$$

where T(DG) is the connectivity matrix for DG, label alphabet set H is $\{0,1\}^n$ for some positive integer n, P is a vector of real numbers, P≥0, m is a positive integer, and m/n≤λ, where λ is the largest eigenvalue of T.

More specifically, given a digraph DGs with its approximate eigenvector AEs, $$Ts(DGs)*AEs(DGs) > Ps+2^m*AEs(DGs) \qquad \text{(Eq 2)}$$

where Ts(DG) is the transition matrix for DGs and Ps≥0 is a vector of real numbers.

To split a state i into two states, state i1 and state i2, a weight is assigned to each arc e outgoing from state i, where the weight of arc e is equal to AEs, the coefficient of the starting approximate eigenvector AEs for the terminating state of arc e. The outgoing edges from state i are partitioned into two sets, one with total weight w*$2^m$ and one with total weight (AEs(state i)−w)*$2^m$, for some positive integer w. State i is then split into two states, state i1 and state i2. The set of arcs with weight w*$2^m$ are given to state i1 and the set of arcs with weight (AEs(state i)−w)*$2^m$ are given to state i2. Incoming arcs of state i are duplicated for state i1 and state i2. If outgoing arcs from state i cannot be partitioned in this manner, state i is not split. A state-splitting step does not change the constraint system, so S(DGs)=S(DGs after splitting of state i). Only the representing digraph has changed.

Traditional state-split based coding methods suggest a sequence of state splitting that results in a digraph DGf having an approximate eigenvector AEf with all ones and zeros coordinates according to Equation 3:

$$Tf(DGf)*AEf(DGf) > Pf+2^m*AEf(DGf) \qquad \text{(Eq 3)}$$

A map F: $V_{DGf}$(state set of DGf)→$V_{DGs}$(state set of DGs) can be defined such that F(state t)=state j if state t can be traced back to state i through the steps of state splitting in the natural sense. Also, the number of branches of a state t, in DGf, is L if F(follower set(state t)) has cardinality L.

Figure 5:
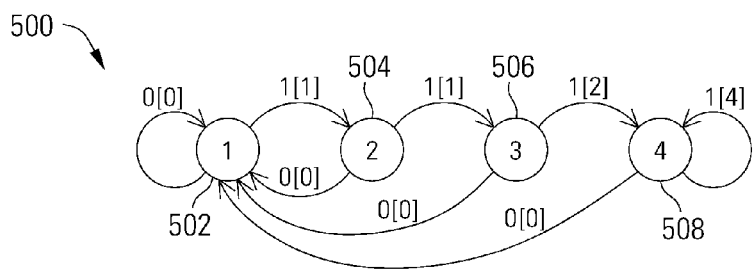
FIG. 5 depicts a finite state transition diagram for an E6SR run length limiting code that can be implemented in an encoder and decoder with table compression in accordance with some embodiments of the present invention.

Again, the encoder and decoder with table compression is not limited to use with any particular type of encoding. In some embodiments, the encoder and decoder with table compression implements an E6SR run length limiting code. Turning now to FIG. 5, a finite state transition diagram 500 for an E6SR run length limiting code is depicted in accordance with some embodiments of the present invention, with four states 502, 504, 506, 508 having constraint costs 1, 2, 3, 4, respectively. Transitions or edges between states 502, 504, 506, 508 are labeled with the bits that cause the associated transitions, followed by a soft constraint cost in brackets. From state 1 502, a 0 bit leads back state 1 502 with a soft constraint cost of 0, and a 1 bit leads to state 2 504 with a soft constraint cost of 1. From state 2 504, a 0 bit leads to state 1 502 with a soft constraint cost of 0, and a 1 bit leads to state 3 506 with a soft constraint cost of 1. From state 3 506, a 0 bit leads to state 1 502 with a soft constraint cost of 0, and a 1 bit leads to state 4 508 with a soft constraint cost of 2. From state 4 508, a 0 bit leads to state 1 502 with a soft constraint cost of 0, and a 1 bit leads back to state 4 508 with a soft constraint cost of 4. Thus, a cost is assigned to each transition, and the average cost ρ=E[cost per sequence]/output bits per transition. Encoding is performed under the constraint that the average cost is less than a given value. As shown in FIG. 5, as the number of successive bits with value 1 are encoded, the transition cost increases. In some cases, the average cost ρ is kept less than 0.5938 or 57/97. In some embodiments, the encoder has a rate of 96/97, meaning that T1 is 96 clock bits, and the encoder outputs 97 encoded bits for each 96 input data bits.

Figure 6A:
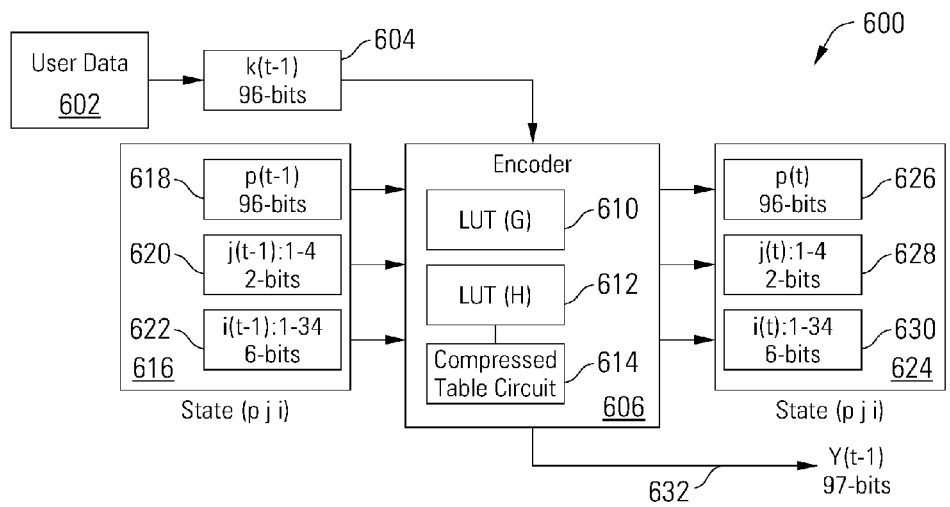
FIG. 6A depicts an E6SR state split run length limiting encoder with lookup table compression in accordance with some embodiments of the present invention.

Turning now to FIG. 6A, an E6SR state split run length limiting encoder 600 with lookup table compression is depicted in accordance with some embodiments of the present invention. The E6SR run length limiting state-split encoding hardware includes logic and memory 606, with the memory or lookup tables 610, 612 taking the majority of the circuit area. In particular, without applying table compression, the LUT(H) lookup table 612 is much larger than the LUT(g) lookup table 610. A table compression circuit 614 is thus included to enable entries in the LUT(H) lookup table 612 to be compressed, decompressing entries as they are accessed. As will be described in more detail below, any of a number of compression techniques can be implemented by table compression circuit 614, including linear compression techniques such as first-order column difference, column averaging, and row+column difference based compression, and polynomial curve fitting compression techniques such as polynomial fitting, piecewise polynomial fitting, and logarithm+polynomial fitting.

At time t−1, the encoder 600 takes in a 96 bit user data block k(t−1) 604 from input user data 602. The encoder 96 is implemented as a finite state machine with state (p j i), updating state 616 at time t−1 as 96 bit user data block k(t−1) 604 is encoded, yielding an updated state 624 at time t and outputting 97 encoded data bits Y(t−1) 632. The states 616 include a 96-bit state p 618, 626, a 2-bit state j 620, 628, and a 6-bit state i 622, 630.

Figure 6B:
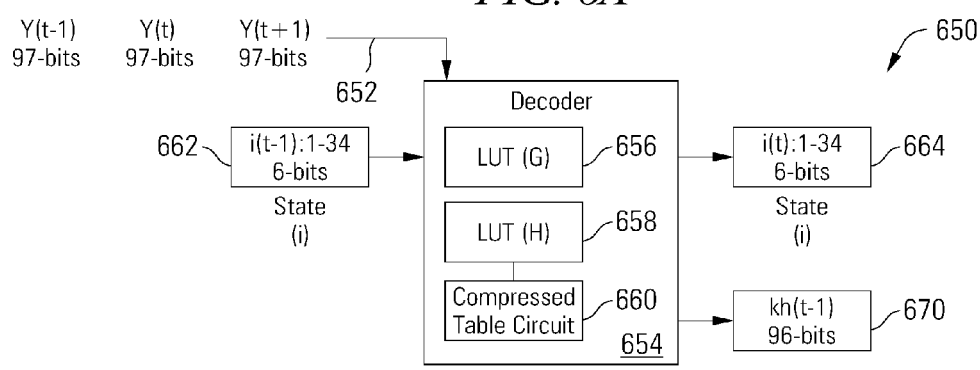
FIG. 6B depicts a decoder with lookup table compression in accordance with some embodiments of the present invention.

A corresponding decoder 650 is depicted in FIG. 6B in accordance with some embodiments of the present invention. The E6SR run length limiting state-split decoding hardware includes logic and memory 654, with the memory or lookup tables 656, 658 taking the majority of the circuit area. In particular, without applying table compression, the LUT(H) lookup table 658 is much larger than the LUT(g) lookup table 656. A table compression circuit 660 is thus included to enable entries in the LUT(H) lookup table 658 to be compressed, decompressing entries as they are accessed. As will be described in more detail below, any of a number of compression techniques can be implemented by table compression circuit 658, including linear compression techniques such as first-order column difference, column averaging, and row+column difference based compression, and polynomial curve fitting compression techniques such as polynomial fitting, piecewise polynomial fitting, and logarithm+polynomial fitting.

The decoder 650 is implemented as a finite state machine with state (i), updating state 662 at time t−1 as 97 encoded bits are decoded, yielding an updated state 664 at time t. To decode 97 encoded bits Y(t−1), the decoder 650 uses two lookahead codewords Y(t) and Y(t+1) at input 652. The decoder 650 generates a reproduction of 96 user data bits k(t−1) 670 corresponding to the 97 encoded bits Y(t−1), and updates state i(t−1) 662 to state i(t) 664.

Again, the encoder and decoder are not limited to any particular code or algorithm. The encoder and decoder can include any suitable circuits with lookup tables for encoding and decoding data. Based upon the disclosure provided herein, one of ordinary skill in the art will recognize a variety of encoder and decoder circuits that can be used in relation to different embodiments of the present invention.

In some embodiments, the LUT(H) lookup table includes 200 columns and 153 rows of 12-bit entries as follows to enable the encoder or decoder to implement the state-split based encoding or decoding:

$$\begin{pmatrix} a_{1,1} & \cdots & \cdots & a_{1,200} \\ \vdots & \ddots & \ddots & \vdots \\ a_{153,1} & \cdots & \cdots & a_{153,200} \end{pmatrix}$$

In some embodiments, entries in the lookup table are compressed using linear techniques, such as, but not limited to, first-order column difference, column averaging, and row+column difference. In general, some such linear compression techniques apply the Perron-Frobenius theorem for a non-negative matrix A:

$$\lim_{k \to \infty} A^k / r^k = vw^T$$

where r is a real and largest eigenvalue of matrix A, v and w are column vectors, $w^T$ is a row vector, and where the left and right eigenvectors for A are normalized so that $w^T v=1$. With the lookup table denoted as M, it can be represented as:

$$M = [A^1(:,1)/2^1 \ A^2(:,1)/2^2 \ A^3(:,1)/2^3 \ldots A^k(:,1)/2^k]$$

where $A^i(:,1)$ values are each column vectors arranged in sequence to form matrix M, and where rate r=2−2ε, and ε>0. Because ε is very small, the representation of M can be rewritten as follows:

$$M \approx [a*r^1/2^1 \ a*r^2/2^2 \ a*r^3/2^3 \ldots a*r^k/2^k]$$

$$=[a*(1-\epsilon)^1 \ a*(1-\epsilon)^2 \ a*(1-\epsilon)^3 \ldots a*(1-\epsilon)^k]$$

$$\text{diff 1: } [\bullet \ a*(1-\epsilon)^1*\epsilon \ a*(1-\epsilon)^2*\epsilon \ldots a*(1-\epsilon)^{k-1}*\epsilon]$$

$$\text{diff 2: } [\bullet \ldots a*(1-\epsilon)^1*\epsilon^2 \ldots a*(1-\epsilon)^{k-1}*\epsilon^2]$$

where $a=(w^T v)(:,1)$. Diff 1 is a function that subtracts the second column of M from the first column ($a*(1-\epsilon)^1*\epsilon = a*(1-\epsilon)^1 - a*(1-\epsilon)^2$), and subtracts the third column from the second column ($a*(1-\epsilon)^2*\epsilon = a*(1-\epsilon)^2 - a*(1-\epsilon)^3$), etc., yielding differences of columns. Diff 2 applies the same function to Diff 1. Notably, a tends to have much larger coordinates than ε, and 1−ε is approximately 1. Each Diff 1 result is multiplied by ε, so the magnitudes of coordinates in Diff 1 are smaller than the magnitudes of coordinates in M, and when this is repeated in Diff 2, the coordinate magnitudes become even smaller.

In general, ε is small because the rate of the code is ≤log$_2$(r), where r is the largest eigenvalue of A. For example, when designing several codes with different rates, if the largest rate is 200/201 and r<2, $2^{(200/201)} \leq r$. With a replacement of 2−2ε for r, 1.9931≤2−2ε<2, ⇒ 2ε≤0.0069, and ε≤0.0034.

This process can be repeated to continue to shrink the coordinate magnitudes, reducing the number of bits required to store each entry in the lookup table at the cost of having to compute or reconstruct the original entries from the compressed entries when reading the lookup table. Rather than storing 12-bit entries of M, compressed entries with fewer bits are stored, and the original 12-bit entries are computed by the compressed table circuit (e.g., 614, 660) when accessing the lookup table. In this compression example, the first and second columns of M are stored in the lookup table, along with the Diff 2 values, the original entries of M can be reconstructed without loss. In some embodiments of table compression, additional columns of M are selected and stored in periodic fashion, so that the reconstruction of an entry toward the far right column of M need not be computed based on every column from the left-most column. In other words, the Diff functions can be periodically restarted by storing periodically selected columns of M.

A first-order column difference table compression technique, in summary, stores column differences in place of some of the original entries of the lookup table. Given the following general structure of a lookup table:

$$\begin{pmatrix} a_{1,1} & \cdots & \cdots & a_{1,200} \\ \vdots & \ddots & \ddots & \vdots \\ a_{153,1} & \cdots & \cdots & a_{153,200} \end{pmatrix}$$

the row $a_{1,1} \ a_{1,2} \ a_{1,3} \ldots$ becomes $a_{1,1} \ a_{1,2}-a_{1,1} \ a_{1,3}-a_{1,1} \ldots$.

The following example of uncompressed lookup table entries:

| $a_1$ | $a_2$ | $a_3$ | $a_4$ | $a_5$ | $a_6$ | $a_7$ | $a_8$ |
|---|---|---|---|---|---|---|---|
| 1004 | 962 | 924 | 1781 | 1726 | 1672 | 1619 | 1567 |
| 1132 | 1089 | 1045 | 2005 | 1927 | 1861 | 1801 | 1743 |
| 1265 | 1213 | 1166 | 2240 | 2150 | 2065 | 1990 | 1922 |
| 1410 | 1341 | 1284 | 2468 | 2372 | 2279 | 2190 | 2109 |
| 1628 | 1501 | 1413 | 2693 | 2583 | 2484 | 2390 | 2300 |
| 1947 | 1738 | 1587 | 2960 | 2803 | 2681 | 2577 | 2482 |
| 2279 | 2033 | 1824 | 3322 | 3079 | 2898 | 2761 | 2650 | is transformed to the following compressed lookup table using first-order column difference compression:

| $a_1$ | $a_2-a_1$ | $a_3-a_1$ | $a_4-a_1$ | $a_5-a_1$ | $a_6-a_1$ | $a_7-a_1$ | $a_8-a_1$ |
|---|---|---|---|---|---|---|---|
| 1004 | −42 | −80 | 777 | 722 | 668 | 615 | 563 |
| 1132 | −43 | −87 | 873 | 795 | 729 | 669 | 611 |
| 1265 | −52 | −99 | 975 | 885 | 800 | 725 | 657 |
| 1410 | −69 | −126 | 1058 | 962 | 869 | 780 | 699 |
| 1628 | −127 | −215 | 1065 | 955 | 856 | 762 | 672 |
| 1947 | −209 | −360 | 1013 | 856 | 734 | 630 | 535 |
| 2279 | −246 | −455 | 1043 | 800 | 619 | 482 | 371 |

Because the magnitude of the entries is reduced by storing first-order column differences (and signs) along with the original column, the number of bits required overall to store the entries of the lookup table is reduced.

Some embodiments of linear compression of lookup table entries employ column averaging. When each column of a lookup table closely approximates a skewed Gaussian curve, an entry can be approximated by the average of its neighbors, either immediate neighbors or in other combinations. For example, given a first row $a_{1,1}\ a_{1,2}\ a_{1,3}\ a_{1,4}\ a_{1,5}\ \ldots$, if the first and fifth column entries $a_{1,1}$ and $a_{1,5}$ are stored in the compressed lookup table, the entry $a_{1,3}$ can be replaced by a difference between the original entry $a_{1,3}$ and an average of the first and fifth column entries as follows:

$$a_{1,3} \Rightarrow a_{1,3} - \frac{(a_{1,1} + a_{1,5})}{2}.$$

The entry $a_{1,2}$ can be replaced by a difference between the original entry $a_{1,2}$ and an average of the first and third column entries as follows:

$$a_{1,2} \Rightarrow a_{1,2} - \frac{(a_{1,1} + a_{1,3})}{2}.$$

The entry $a_{1,4}$ can be replaced by a difference between the original entry $a_{1,4}$ and an average of the third and fifth column entries as follows:

$$a_{1,4} \Rightarrow a_{1,4} - \frac{(a_{1,3} + a_{1,5})}{2}.$$

To reconstruct the third column entry, the unchanged first and fifth column entries are read, averaged and added to the stored compressed third column entry. To reconstruct the second column entry, the third column entry is reconstructed, and the unchanged first column entry is averaged with the reconstructed third column entry and the result is added to the stored compressed second column entry. With this column averaging, the unchanged first and fifth column entries are each stored with 12 bits, the second and third column entries are each stored with 2 bits, and the fourth column is stored with 3 bits.

In some embodiments, instead of dividing to perform the averaging, values are "rounded up" by ignoring the last two bits. The division by two shifts values, effectively rounding up the values as shown below:

```
Col 1:  [A11  A10  A09  A08  A07  A06  A05  A04  A03  A02  A01  A00]  =
        [a11  a10  a09  a08  a07  a06  a05  a04  a03  a02  a01  a00]      ← Col 1
Col 3:  [C11  C10  C09  C08  C07  C06  C05  C04  C03  C02  C01  C00]  =
        [0    a11  a10  a09  a08  a07  a06  a05  a04  a03  a02  0 ]   +  ← Col 1
        [0    e11  e10  e09  e08  e07  e06  e05  e04  e03  e02  0 ]   +  ← Col 5
        [c11  c10  c09  c08  c07  c06  c05  c04  c03  c02  c01  c00]     ← Col 3
Col 2:  [B11  B10  B09  B08  B07  B06  B05  B04  B03  B02  B01  B00]  =
        [0    a11  a10  a09  a08  a07  a06  a05  a04  a03  a02  a01]  +  ← Col 1
        [0    0    a11  a10  a09  a08  a07  a06  a05  a04  a03  a02]  +  ← Col 1
        [0    0    e11  e10  e09  e08  e07  e06  e05  e04  e03  e02]  +  ← Col 5
        [0    c11  c10  c09  c08  c07  c06  c05  c04  c03  c02  c01]  +  ← Col 3
        [b11  b10  b09  b08  b07  b06  b05  b04  b03  b02  b01  b00]     ← Col 2
Col 4:  [D11  D10  D09  D08  D07  D06  D05  D04  D03  D02  D01  D00]  =
        [0    e11  e10  e09  e08  e07  e06  e05  e04  e03  e02  e01]  +  ← Col 5
        [0    0    a11  a10  a09  a08  a07  a06  a05  a04  a03  a02]  +  ← Col 1
        [0    0    e11  e10  e09  e08  e07  e06  e05  e04  e03  e02]  +  ← Col 5
        [0    c11  c10  c09  c08  c07  c06  c05  c04  c03  c02  c01]  +  ← Col 3
        [d11  d10  d09  d08  d07  d06  d05  d04  d03  d02  d01  d00]     ← Col 4
Col 5:  Repeat
```

As shown above, column 3 can be reconstructed by columns 1 and 5, shifted one place to the right, with the rightmost values zeroed out, and added to the stored compressed values of column 3, to yield the reconstructed column 3. Similar operations are performed to reconstruct columns 2 and 4. Thus, the column-averaging equations described above which use division can be replaced by shifting and addition.

Some embodiments of linear compression of lookup table entries employ row+column averaging. The first row is generated using first-order column differences as described above, e.g., $a_{1,1}\ a_{1,2}-a_{1,1}\ a_{1,3}-a_{1,1}\ \ldots$. The initial or seed entries in the second row are generated by subtracting the entry from the preceding row in the same column from the original value of the entry, with subsequent entries in the row generated by first-order column differences. In the next row, the initial or seed entry is stored unchanged, with entries in subsequent columns being generated by a combination of row and column differences. This is summarized in the following matrix, in which the pattern shown is restarted and repeated to extend the matrix:

$$\begin{pmatrix} a_{1,1} & a_{1,2}-a_{1,1} & a_{1,3}-a_{1,1} & a_{1,4}-a_{1,1} & \cdots \\ a_{2,1}-a_{1,1} & a_{2,2}-a_{2,1} & a_{2,3}-a_{2,1} & a_{2,4}-a_{2,1} & \cdots \\ a_{3,1} & (a_{3,2}-a_{3,1})- \\ (a_{2,2}-a_{2,1}) & (a_{3,3}-a_{3,1})- \\ (a_{2,3}-a_{2,1}) & (a_{3,4}-a_{3,1})- \\ (a_{2,4}-a_{2,1}) & \cdots \\ a_{4,1}-a_{3,1} & a_{4,2}-a_{4,1} & a_{4,3}-a_{4,1} & a_{4,4}-a_{4,1} & \cdots \\ a_{5,1} & (a_{5,2}-a_{5,1})- \\ (a_{4,2}-a_{4,1}) & (a_{5,3}-a_{5,1})- \\ (a_{4,3}-a_{4,1}) & (a_{5,4}-a_{5,1})- \\ (a_{4,4}-a_{4,1}) & \cdots \\ a_{6,1}-a_{5,1} & a_{6,2}-a_{6,1} & a_{6,3}-a_{6,1} & a_{6,4}-a_{6,1} & \cdots \\ a_{7,1} & (a_{7,2}-a_{7,1})- \\ (a_{6,2}-a_{6,1}) & (a_{7,3}-a_{7,1})- \\ (a_{6,3}-a_{6,1}) & (a_{7,4}-a_{7,1})- \\ (a_{6,4}-a_{6,1}) & \cdots \\ a_{8,1}-a_{7,1} & a_{8,2}-a_{8,1} & a_{8,3}-a_{8,1} & a_{8,4}-a_{8,1} & \cdots \\ \vdots & \vdots & \vdots & \vdots & \ddots \end{pmatrix}$$

In general, linear compression of lookup table entries with row+column averaging enables storage of difference entries in about 7 bits instead of the original 12 bits, using only two adders to recover the original entries.

Figure 7:
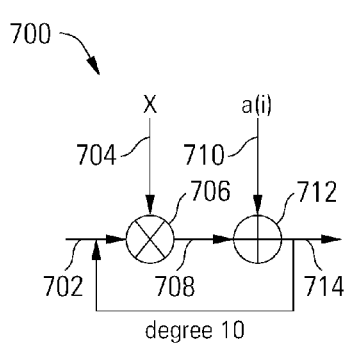
FIG. 7 depicts a polynomial calculation circuit for polynomial table compression in an encoder and decoder in accordance with some embodiments of the present invention.

In some embodiments, entries in the lookup table are compressed using polynomial methods, such as, but not limited to, polynomial fitting, piecewise polynomial fitting and logarithm+polynomial fitting. Each column of the lookup table approximates a skewed Gaussian curve, and columns can be approximated by a high-order polynomial. In some embodiments, each column can be reasonably approximated by a degree-10 polynomial, and the difference between the actual column values and the degree-10 polynomial fit of the skewed Gaussian curve following the column values is small and can be represented with at most 5 bits. Using polynomial fitting, instead of storing the original column, the difference between the actual column values and the degree-10 polynomial fit corresponding to that column is stored, reducing the number of bits required from 12 to 5. For each column, the coefficients of the degree-10 polynomial are also stored. To generate the original column value, the polynomial approximation for that column is computed using 10 multiplications and 10 additions. An example circuit 700 to perform this calculation is depicted in FIG. 7. A multiplier 706 multiplies a coefficient 702 of the polynomial by the coordinate index x 704, and the result 708 is added to the next coefficient 710 in adder 712 to yield output 714.

As an example, consider a degree 5 polynomial P, [a0 a1 a2 a3 a4], and an x value that can be represented as P(x)=a0x0+a1x1+a2x2+a3x3+a4x4, x0=1. This can be computed in hardware using one adder 712 and one multiplier 706 as follows. In step 1, multiply a4 by x (a4x1). In step 2, add a3 (a4x1+a3). In step 3, multiply a4x1+a3 by x (a4x2+a3x1). In step 4, add a2 (a4x2+a3x1+a2). In step 5, multiply a4x2+a3x1+a2 by x (a4x3+a3x2+a2x1). In step 6, add a1 (a4x3+a3x2+a2x1+a1). In step 7, multiply a4x3+a3x2+a2x1+a1 by x (a4x4+a3x3+a2x2+a1x1). In step 8, add a0 (a4x4+a3x3+a2x2+a1x1+a0), yielding result P(x).

For a lookup table of 103x97 entries which each require 12 bits when uncompressed, the table compressed with a degree-10 polynomial fitting uses 103x97 5-bit entries, ten multipliers, ten adders, and an 11x103 polynomial table storing the polynomial coefficients.

Some embodiments of polynomial compression of lookup table entries employ piecewise polynomial fitting, in which different parts of the column are approximated with different polynomials. For example, if the skewed Gaussian curve representing the column is divided into three different sections, one with a rising curve, one with a peak, and one with a falling curve, each section can be represented by a different polynomial with a lower degree. In one example embodiment, the section with the rising curve is represented by a degree 6 polynomial, the section with the peak is represented by a degree 4 polynomial, and the section with the falling curve is represented by a degree 4 polynomial. In this case, the difference between the actual column values and the corresponding polynomial is even smaller, at most 2 bits.

The division of the curve into sections can be performed, for example, by simulating the cut positions with a computer to identify the best positions for the cuts using an exhaustive search. The piecewise polynomial fitting can divide a column (and its associated curve) into any number of sections, although the first few divisions of the curve into sections provides a relatively large shrinkage of the lookup table and there are diminishing gains as the number of sections is increased.

Figure 8:
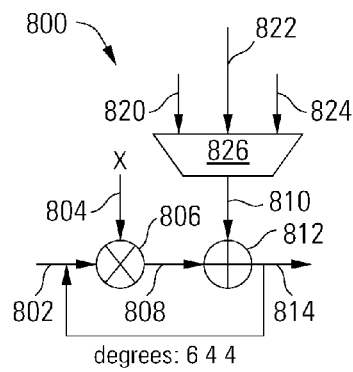
FIG. 8 depicts a polynomial calculation circuit for piecewise polynomial table compression in an encoder and decoder in accordance with some embodiments of the present invention.

An example circuit 800 to reconstruct lookup table entries based on polynomials is depicted in FIG. 8. A multiplier 806 multiplies a coefficient 802 of the polynomial by the coordinate index x 804, and the result 808 is added to the next coefficient 810 in adder 812 to yield output 814. At each different section of the column, the different coefficients 820, 822, 824 of each of three polynomials are selected in a multiplexer 826.

Some embodiments of polynomial compression of lookup table entries employ logarithm+polynomial fitting. In this method, the logarithms of the column values are first calculated. Because the column values are approximately Gaussian, their logarithms are approximated by polynomials having small order. If the column values were exact Gaussian curves, their logarithms could be generated using second order polynomials or degree 2 polynomials. Thus, by taking the logarithms of the original uncompressed lookup table, then the curves represented by the logarithms can be fit with low degree polynomials, which are stored as described above with respect to the polynomial fitting table compression. The inverse of the logarithms or exponentiation values are also stored, enabling the logarithm calculations to be reversed once polynomial calculations are performed as described above. Polynomial compression of lookup table entries using logarithm+polynomial fitting effectively reduces the degree of the approximating polynomials by two to three.

Figure 9:
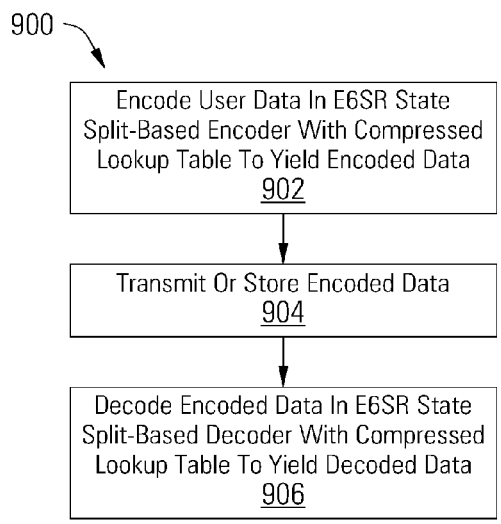
FIG. 9 depicts a flow diagram showing a method for run length limiting encoding and decoding in an encoder and decoder in accordance with some embodiments of the present invention.

Turning now to FIG. 9, flow diagram 900 depicts a method for run length limiting encoding and decoding in an encoder and decoder with table compression in accordance with some embodiments of the present invention. Following flow diagram 900, user data is encoded in an E6SR state split-based encoder with compressed lookup table to yield encoded data. (Block 902) The encoded data can be further processed as desired, for example performing error correction coding such as low density parity check encoding. The encoded data is transmitted or stored as needed. (Block 904) The encoded data is read or received and is decoded in a decoder with compressed lookup table to yield decoded data. (Block 906) When encoding and decoding, original entries used for the encoding and decoding are reconstructed based on compressed entries in the lookup table. Entries in the lookup table can be compressed using linear compression techniques, including first-order column difference, column averaging, and row+column difference based compression, or polynomial curve fitting compression techniques, including polynomial fitting, piecewise polynomial fitting, and logarithm+polynomial fitting.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that some functions of the blocks, systems or circuits discussed herein may be implemented in either software or firmware in combination with hardware circuits.

In conclusion, the present invention provides novel apparatuses and methods for state-split based encoding and decoding of data for constrained systems with compressed lookup tables. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data encoder comprising:
an encoding logic circuit configured to encode input data to apply run length limiting using state splitting of a code trellis; and
a lookup table configured to apply a block-enumerable map on an un-split version of the code trellis, wherein entries in the lookup table are compressed.

2. The data encoder of claim 1, wherein the encoding logic circuit is configured to implement an E6SR cost-constrained run length limited code.

3. The data encoder of claim 1, wherein the data encoder comprises a 96/97 rate.

4. The data encoder of claim 1, wherein the encoding logic circuit is operable to encode the data based on a finite state transition diagram having a cost assigned to each transition to apply a constraint such that an average cost is less than a given value.

5. The data encoder of claim 1, wherein the entries in the lookup table are compressed by a linear method.

6. The data encoder of claim 5, wherein the entries in the lookup table are compressed using a first-order column difference to store column differences in place of original entries.

7. The data encoder of claim 5, wherein each column in the lookup table approximates a skewed Gaussian curve and the entries in the lookup table are compressed using column averaging.

8. The data encoder of claim 5, wherein each column in the lookup table are compressed using row and column differences.

9. The data encoder of claim 8, further comprising a pair of adders operable to recover original entries for the lookup table based on the row and column differences.

10. The data encoder of claim 1, wherein the entries in the lookup table are compressed by a polynomial method.

11. The data encoder of claim 10, wherein each column in the lookup table approximates a skewed Gaussian curve approximated by a polynomial, and wherein the entries in the lookup table are compressed by storing differences between actual column values and a polynomial fit for the actual column values.

12. The data encoder of claim 10, wherein each column in the lookup table approximates a skewed Gaussian curve approximated by a polynomial, and wherein a plurality of sections of each column are approximated by a different polynomial, and wherein the entries in the lookup table are compressed by storing differences between actual column values and the polynomials.

13. The data encoder of claim 10, wherein each column in the lookup table approximates a skewed Gaussian curve approximated by polynomials of logarithms of the column values, and wherein the entries in the lookup table are compressed by storing differences between actual column values and the polynomials.

14. A method of encoding data, comprising:
receiving input data to be encoded;
performing state split-based encoding of the input data in an encoder circuit including retrieving compressed entries from a lookup table used in the state split-based encoding and reconstructing uncompressed entries based on the compressed entries to yield encoded data; and
outputting the encoded data from the encoder circuit.

15. The method of claim 14, wherein the compressed entries in the lookup table are compressed with a linear method.

16. The method of claim 15, wherein the compressed entries are compressed at least in part by calculating differences between columns of the uncompressed entries.

17. The method of claim 14, wherein the compressed entries in the lookup table are compressed with a polynomial method.

18. The method of claim 17, wherein at least some of the compressed entries are stored in the lookup table as differences between the uncompressed entries and polynomials.

19. The method of claim 18, wherein at least some of the compressed entries are based on logarithms of the uncompressed entries.

20. A data processing system, comprising:
encoding means comprising:
an encoding logic circuit configured to encode input data to apply run length limiting using state splitting of a code trellis; and
a lookup table with compressed entries, configured to apply a block-enumerable map on an un-split version of the code trellis; and
decoding means comprising a second lookup table with compressed entries.

* * * * *